(12) United States Patent
Sartore

(10) Patent No.: US 8,008,894 B2
(45) Date of Patent: Aug. 30, 2011

(54) ADJUSTING A TOP CHARGE CAPACITOR VOLTAGE ACCORDING TO AN OPERATING TEMPERATURE OF THE CAPACITOR

(75) Inventor: Ronald H Sartore, Poway, CA (US)

(73) Assignee: Agiga Tech Inc., San Diego, CA (US)

( * ) Notice: Subject to any disclaimer, the term of this patent is extended or adjusted under 35 U.S.C. 154(b) by 262 days.

(21) Appl. No.: 12/328,931

(22) Filed: Dec. 5, 2008

(65) Prior Publication Data

US 2010/0142307 A1    Jun. 10, 2010

(51) Int. Cl.
*H01M 10/44* (2006.01)
(52) U.S. Cl. ........................................... 320/166
(58) Field of Classification Search .................. 320/107, 320/112, 134, 136, 166, 167; 327/545; 365/228
See application file for complete search history.

(56) References Cited

U.S. PATENT DOCUMENTS

| 5,563,496 | A * | 10/1996 | McClure ........................ 320/128 |
| 6,862,240 | B2 * | 3/2005 | Burgan ........................... 365/222 |
| 6,870,421 | B2 * | 3/2005 | Abe ................................ 327/539 |
| 7,661,002 | B2 * | 2/2010 | Pecone et al. .................. 713/300 |
| 2005/0283648 | A1 | 12/2005 | Ashmore |
| 2006/0015683 | A1 | 1/2006 | Ashmore et al. |
| 2006/0212651 | A1 | 9/2006 | Ashmore et al. |
| 2007/0033431 | A1 | 2/2007 | Pecone et al. |
| 2007/0033432 | A1 | 2/2007 | Pecone et al. |
| 2007/0033433 | A1 | 2/2007 | Pecone et al. |
| 2008/0303488 | A1 * | 12/2008 | Khan ............................ 320/167 |

* cited by examiner

*Primary Examiner* — Edward Tso
(74) *Attorney, Agent, or Firm* — FSP LLC

(57) ABSTRACT

An apparatus includes a capacitor and logic to adjust an operating temperature of the capacitor according to a charge on the capacitor, and/or to adjust a charge of the capacitor according to the operating temperature of the capacitor to improve the useful life of the capacitor and increase its reliability.

12 Claims, 5 Drawing Sheets

ADJUSTING A TOP CHARGE CAPACITOR VOLTAGE ACCORDING TO AN OPERATING TEMPERATURE OF THE CAPACITOR

TECHNICAL FIELD

The present disclosure relates to systems that use capacitors to supply power.

BACKGROUND

Capacitors may provide a useful source of power in certain situations, such as for providing backup power when a primary source of power is lost or interrupted. Certain types of capacitors are capable of storing a great deal of energy. Properly harnessed, this energy may be used in place of or in addition to backup battery sources, for substantially less cost than alternative sources of energy.

However, large capacitors with high energy storage capabilities may suffer detriment to their useful lifetimes at high ambient temperatures. This detriment may be especially pronounced when the capacitors are at or near full charge.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

Figure 1:
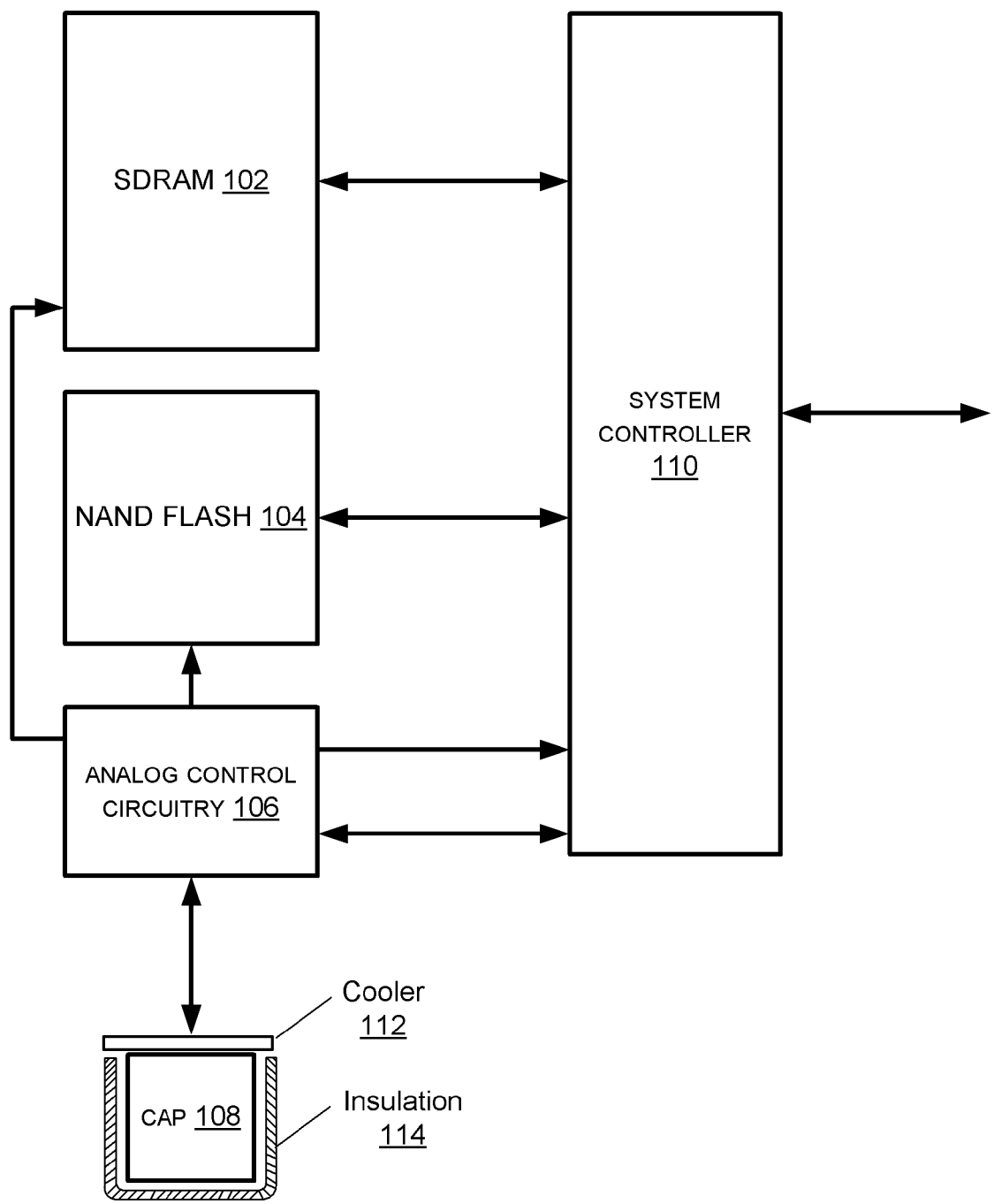
FIG. 1 is a block diagram of an embodiment of a memory system that employs one or more power capacitors.

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list.

"Logic" refers to signals and/or information that may be applied to influence the operation of a device. Software, hardware, and firmware are examples of logic. Hardware logic may be embodied in circuits. In general, logic may comprise combinations of software, hardware, and/or firmware.

Those skilled in the art will appreciate that logic may be distributed throughout one or more devices, and/or may be comprised of combinations of instructions in memory, processing capability, circuits, and so on. Therefore, in the interest of clarity and correctness logic may not always be distinctly illustrated in drawings of devices and systems, although it is inherently present therein.

Systems that require local power in the event of system power failure can employ batteries as backup power. An attractive alternative to batteries is the use of high-value capacitors, commonly known as "Ultra-Capacitors" due to their availability in the 1-50 Farad range. Such capacitors have reduced lifetimes and performance if the capacitor is subjected to high temperatures. This derating is strongly related to the voltage across the capacitor as the temperature is increased. The lower the voltage across the capacitor as the temperature increases, the less is the performance derating. Therefore it would be desirable to manage not only the voltage across the capacitor as it charges and discharges, but also the capacitor operating temperature.

A capacitor may be combined with logic, a cooling mechanism, thermal insulation, and a temperature sensor to adjust an operating temperature of the capacitor according to a charge voltage on the capacitor, and/or to adjust a charge voltage of the capacitor according to the operating temperature of the capacitor. In this manner, combined circumstances that might harm the capacitor's lifetime and/or performance may be avoided. Adjusting an operating temperature of the capacitor may involve controlling the current to a thermal-electric cooling device (e.g. a Peltier plate) in contact or proximity or thermally connected with the capacitor. In addition or alternatively, the maximum allowed voltage on the capacitor may be decreased as the operating temperature increases. An indication may be provided of a limitation on a function powered by the capacitor (such as a memory backup operation), the limitation in relation to an adjusted (diminished) charge voltage on the capacitor. In other words, if the capacitor contains less energy because of a lower charge voltage due to higher operational temperatures, the functions that may be powered by the capacitor (such as effective non-volatile memory size) may need to be scaled back. As a further measure of protection, the capacitor may be discharged upon detecting a system shutdown. This helps ensure that the capacitor is not set with substantial charge in the event the system heats up after shutdown; a time when the thermal electric cooling plate may be unable to operate for lack of power.

FIG. 1 is a block diagram of an embodiment of a memory system that employs one or more power capacitors. The subsystem provides a volatile memory 102 in conjunction with a low-cost non-volatile memory 104. This system exemplifies an application in which a power capacitor 108 may be employed. It is desirable to protect the capacitor 108 from stresses (combinations of operating temperature and charging voltage) that may decrease its useful operating lifetime. To this end, a cooler 112 is applied to the capacitor. The cooler 112 may for example be a thermal-electric (e.g. Peltier) cooling device, used in conjunction with thermal insulation 114 to create something like a refrigeration enclosure around the capacitor 108.

The exemplary memory subsystem includes, but may not be limited to, volatile memory 102, nonvolatile memory 104, control logic 106, one or more power capacitors 108, and a system controller 110. A separate control logic block, independent of block 106, may be deployed to manage the temperature of the capacitor and used in conjunction with block 106. Alternatively, the temperature management logic may be contained in the system controller 110. Other elements and/or couplings among the elements may be apparent to skilled practitioners in the relevant art(s). A memory system in accordance with FIG. 1 is described in more detail in co-pending, co-assigned patent application Ser. No. 11/881,346, entitled HYBRID NONVOLATILE RAM, filed on Jul. 25, 2007, which is incorporated herein by reference in its entirety.

The control logic 106 interfaces the memory subsystem to an external power source, typically the power source of a larger system that incorporates and uses the memory subsystem. For example, the external power source may be the power of personal or business computer system that incorporates the memory subsystem.

The control logic 106 also interfaces the memory subsystem to a backup power source that is local to the memory subsystem. The backup power source may be, for example, a capacitor 108 or small battery (or a combination of the two). In the embodiment of FIG. 1, a capacitor 108 provides power to the memory subsystem for a temporary time when external power fails. The capacitor 108 may provide power for long enough for system controller 110 to copy data blocks from volatile memory 102 to nonvolatile memory 104.

In the event of an external power failure, the memory subsystem may operate as an isolated subsystem of the larger, external system. The control logic 106 may recognize that external system power has failed. The system controller 110 may then initiate backup of data currently stored in the volatile memory 102 into the non-volatile memory 104. Upon restoration of external system power, the system controller 110 may initiate restoration of backed-up data from non-volatile memory 104 to volatile memory 102.

Other examples and/or embodiments of the systems in which power capacitors may be employed may now be apparent to skilled practitioners in the relevant art(s).

Power capacitors in such systems may suffer detrimental effects if operated near full charge at high ambient temperatures. The control logic 106 may thus include logic to maintain one or more of the temperature and charge of the capacitor 108 at safe levels.

Figure 2:
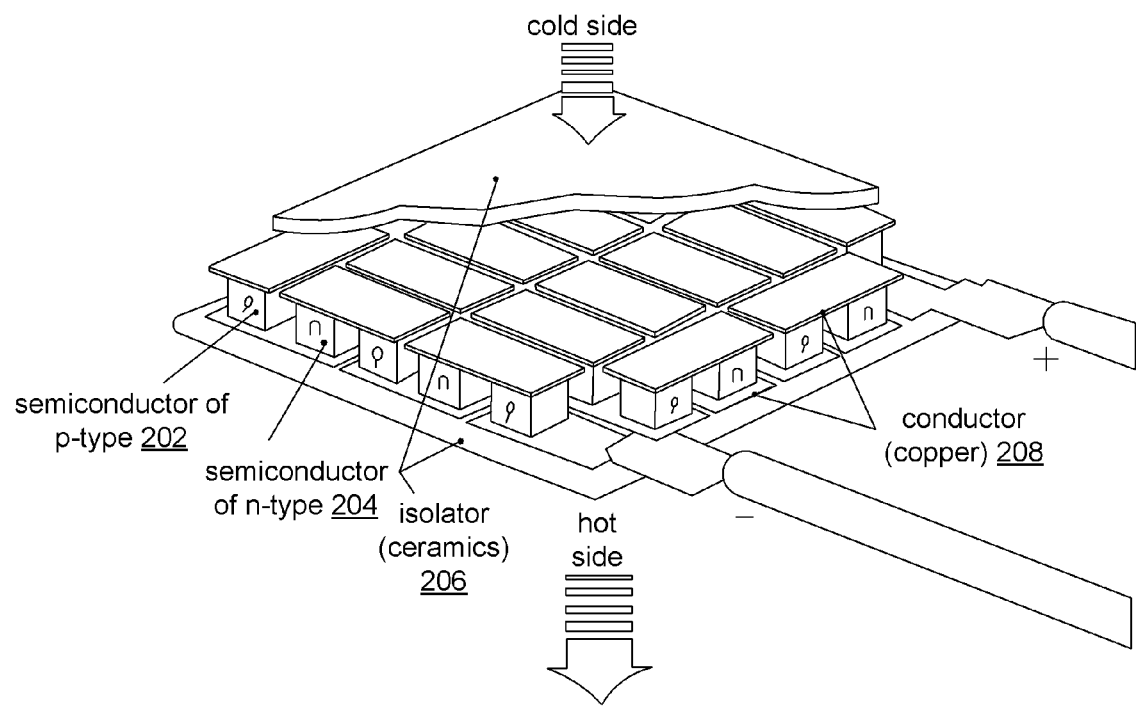
FIG. 2 is an illustration of an embodiment of a thermal-electric cooling apparatus

FIG. 2 is an illustration of an embodiment of a thermal-electric cooling apparatus that may be operated by the control logic 106 to maintain the temperate of the capacitor 108. The cooling device may be operated close to or in contact with the capacitor 108. One or more such cooling plates disposed, for example, in conjunction with insulating layers, may help keep the capacitor 108 cool in environments where the ambient temperature is detrimental to capacitor performance and longevity.

A thermal-electric device employs thermoelectric cooling (e.g. the Peltier effect) to create a heat flux between the junction of two different types of materials. A thermal-electric cooler, heater, or thermoelectric heat pump is a solid-state active heat pump which transfers heat from one side of the device to the other side against the temperature gradient (from cold to hot), with consumption of electrical energy. Simply connecting it to a DC voltage will cause one side to cool, while the other side warms. The effectiveness of the pump at moving the heat away from the cold side is dependent upon the amount of current provided and how well the heat from the hot side can be removed.

In one embodiment, a number of p-type semiconductors 202 are paired with a number of n-type semiconductors and placed into contact with heat conductive plates 208. Isolators 206 may also be used. A potential is applied across the semiconductor blocks resulting in a thermodynamic heat differential.

Figure 3:
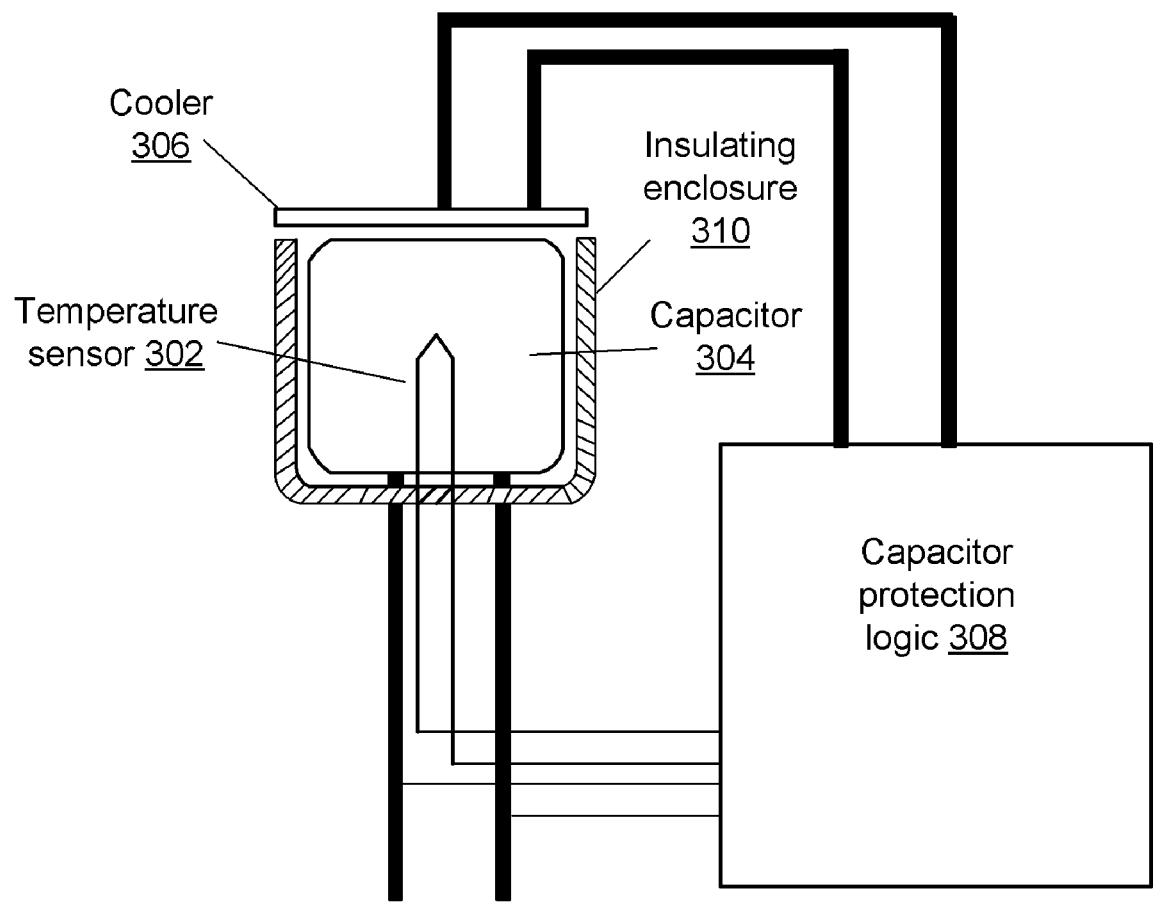
FIG. 3 illustrates an embodiment of capacitor protection logic.

FIG. 3 shows an embodiment of capacitor protection logic. The capacitor protection logic 308 may be part of the system control logic 106, or may be separately implemented. To protect the capacitor 304 from the deleterious effects of high ambient temperatures, the protection logic 308 may employ a temperature sensor 302 (e.g. thermocouple) to detect when the temperature of the capacitor 304 (or the ambient temperature) has become potentially deleterious to capacitor performance and/or lifetime. The protection logic 308 may operate a one or more cooling plates 306 (which may be a Peltier device or some other thermal-electric cooling mechanism) to bring the capacitor temperature to within safe limits. An insulating enclosure 310 may also be employed around the one or more capacitors 304. The protection logic 308 may further detect the capacitor charge level (i.e. the voltage across the capacitor plates), and may adjust the charging level to insure that the voltage across the capacitor is within safe limits for the current temperature conditions.

In some implementations the protection logic 308 maintains a maximum working charge on a capacitor that varies according to temperature conditions. The top charge on the capacitor 302 may be reduced as the operating temperature rises. In this manner, capacitor is prevented and protected from operating under the potentially deleterious combination of circumstances where the capacitor's charge and the ambient temperature combined to reduce the capacitor's longevity or performance.

To protect the capacitor while the system is shut down (when the protection logic 308 may not be functional), the protection logic 308 may detect a system power down and may discharge the capacitor 304 prior to powering down. This way, if the system heats up while it is shut down, the capacitor being discharged will suffer no adverse consequences. It should be noted that a benefit of using a capacitor as the temporary backup power source is that once the contents of volatile memory have been transferred to non-volatile memory, the need for backup power is removed and the capacitor 304 may be discharged by protection logic 308, thereby putting the capacitor into the best possible state to withstand high temperatures.

In addition to controlling the cooler 306 to lower the operating temperature, capacitor protection logic 308 can also adjust the charge level of capacitor 304, and therefore the voltage across the capacitor. Capacitor protection logic 308 may be capable of drawing charge from the capacitor when necessary. When capacitor protection logic 308, using temperature sensor 302, detects an operating temperature which would be deleterious to capacitor 304, protection logic 308 may couple a current sink to draw current and thus charge from capacitor 304, thereby reducing the voltage across capacitor 304 and improving its operational characteristics.

In some implementations, the functions that the capacitor is called upon to provide power for may be scaled according to the ambient temperature. By adjusting the capacitor's load according to temperature, the capacitor's top charge may likewise be adjusted according to temperature. For example, if the capacitor were used to power a data back up function (see FIG. 1), the amount of data that could be reliably backed up would be adjusted according to the system ambient temperature. As the system increasingly grows hotter, the protection logic 308 may adjust not only the capacitor's charge level, but also provide an indication of how much data backup the capacitor could reliably provide power for. The combined effect would be to protect the capacitor from a deleterious combination of charge and temperature.

Figure 4:
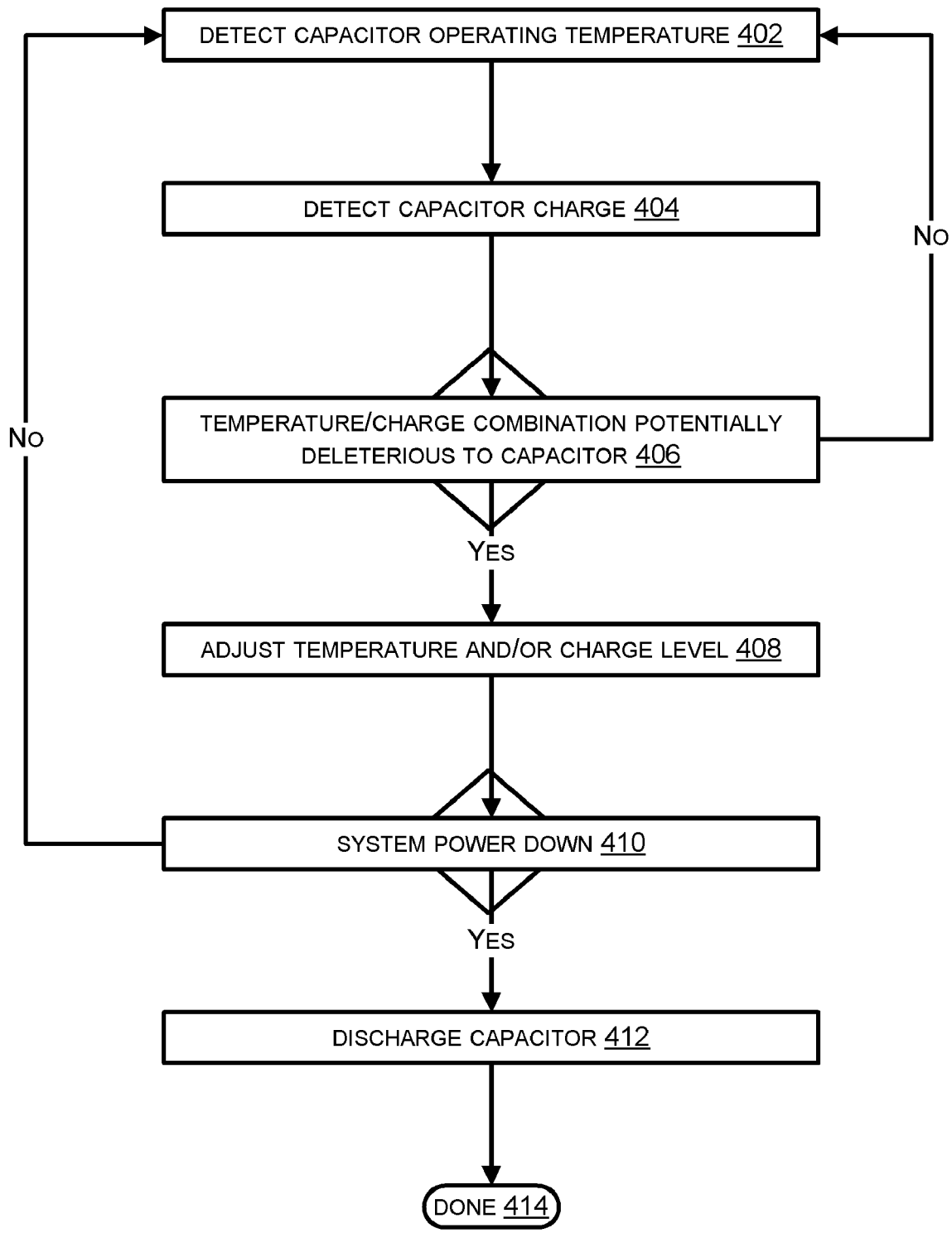
FIG. 4 is a flow chart of an embodiment of a capacitor protection process.

FIG. 4 is a flow chart of an embodiment of a capacitor protection process. The operating temperature of the capacitor is detected (402) as well as (possibly) the charge voltage (404). If the combination of these two values is potentially deleterious to the capacitor (406) one or both of temperature and charge are adjusted (408). In the event of a system power down (410), the capacitor is discharged (412).

Figure 5:
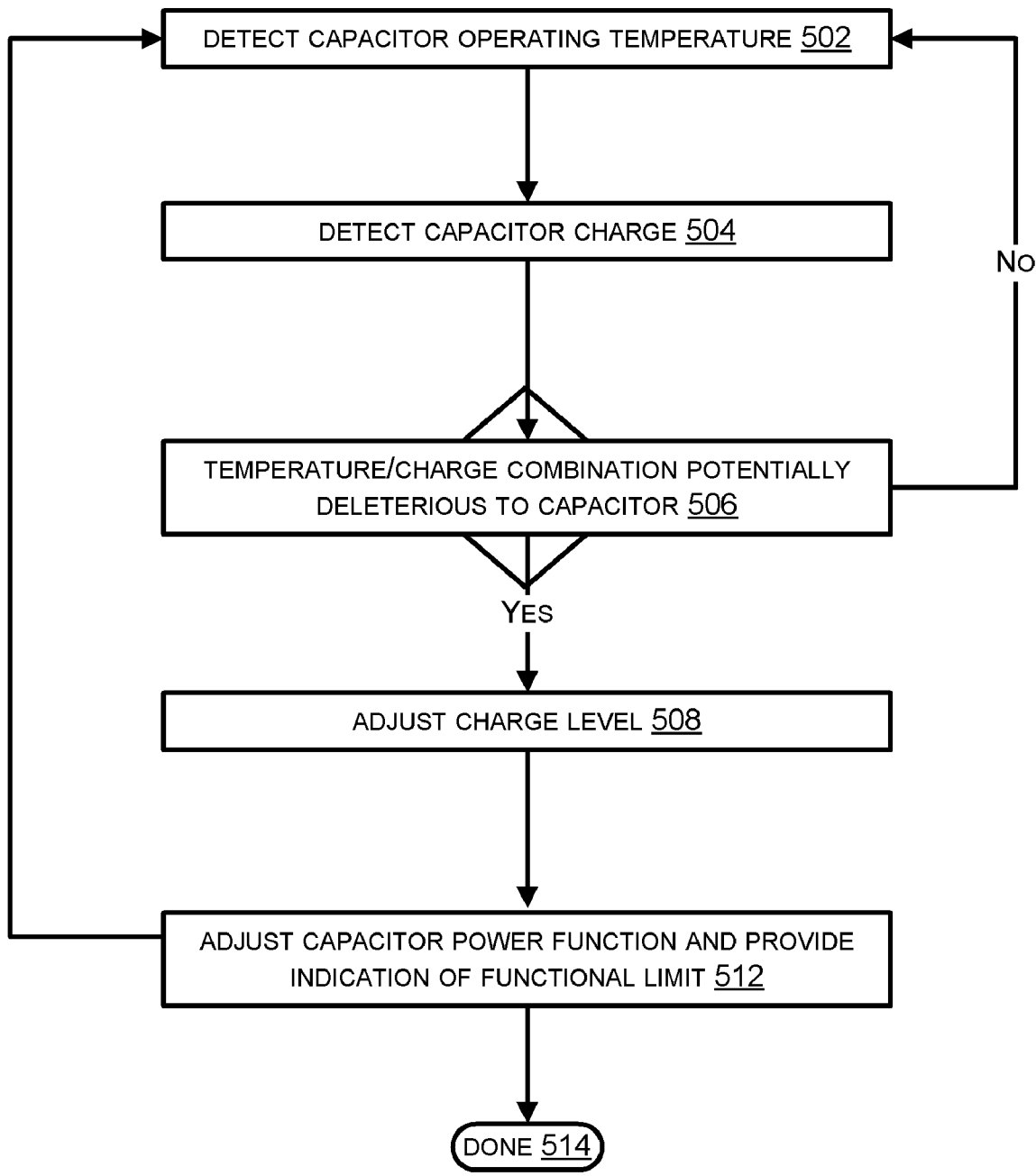
FIG. 5 is a flow chart of an embodiment of a capacitor protection process.

FIG. 5 is a flow chart of an embodiment of a capacitor protection process. The operating temperature of the capacitor is detected (502) as well as (possibly) the charge (504). If the combination of these two values is potentially deleterious to the capacitor (506) the charge is adjusted (508). The capacitor now has less capacity to power system functions. Consequently, the power functions of the capacitor are adjusted with an indication of the new functional limit (e.g. less data can be backed up—512).

Those having skill in the art will appreciate that there are various vehicles by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A method comprising:
    adjusting an operating temperature of a capacitor according to a charge voltage on the capacitor; and
    adjusting an amount of memory backup that may be performed when powered by the capacitor at the charge voltage.

2. A method comprising:
    adjusting a top charge voltage of a capacitor according to the operating temperature of the capacitor; and
    providing an indication of a limitation on a function powered by the capacitor at least under certain conditions, the limitation in relation to an adjusted charge voltage on the capacitor.

3. The method of claim 1, wherein adjusting an operating temperature of the capacitor further comprises:
    controlling the current to a thermal-electric device in contact or proximity with the capacitor.

4. The method of claim 2, wherein adjusting a charge voltage of the capacitor according to the operating temperature of the capacitor further comprises:
   decreasing a top charge voltage on the capacitor as the operating temperature increases.

5. The method of claim 2, wherein providing an indication of a limitation on a function powered by the capacitor further comprises:
   providing a limitation on an amount of memory backup that may be performed.

6. The method of claim 1, further comprising:
   discharging the capacitor upon detecting a system shutdown.

7. The method of claim 2, further comprising:
   discharging the capacitor upon detecting a system shutdown.

8. An apparatus comprising:
   a capacitor, and
   logic to adjust an operating temperature of the capacitor according to a charge voltage on the capacitor, and/or to adjust a charge voltage of the capacitor according to the operating temperature of the capacitor; and
   providing an indication of a limitation on a function powered by the capacitor at least under certain conditions, the limitation in relation to an adjusted charge voltage on the capacitor.

9. The apparatus of claim 8, wherein the logic to adjust an operating temperature of the capacitor according to a charge voltage on the capacitor further comprises:
   logic to control the current to a thermal-electric device in contact or proximity with the capacitor.

10. The apparatus of claim 8, wherein the logic to adjust a charge voltage of the capacitor according to the operating temperature of the capacitor further comprises:
    logic to decrease the top charge voltage on the capacitor as the operating temperature increases.

11. The apparatus of claim 8 wherein the logic to provide an indication of a limitation on a function powered by the capacitor further comprises:
    logic to provide a limitation on an amount of memory backup that may be performed.

12. The apparatus of claim 8, further comprising:
    logic to discharge the capacitor upon detecting a system shutdown.

* * * * *